United States Patent
Schaller et al.

(10) Patent No.: US 12,315,748 B2
(45) Date of Patent: May 27, 2025

(54) WORKPIECE HANDLING ARCHITECTURE FOR HIGH WORKPIECE THROUGHPUT

(71) Applicant: Applied Materials, Inc., Santa Clara, CA (US)

(72) Inventors: Jason M. Schaller, Austin, TX (US); Michael Carrell, Leander, TX (US); William T. Weaver, Austin, TX (US); Charles T. Carlson, Cedar Park, TX (US)

(73) Assignee: Applied Materials, Inc., Santa Clara, CA (US)

( * ) Notice: Subject to any disclaimer, the term of this patent is extended or adjusted under 35 U.S.C. 154(b) by 309 days.

(21) Appl. No.: 17/977,422

(22) Filed: Oct. 31, 2022

(65) Prior Publication Data
US 2024/0145271 A1    May 2, 2024

(51) Int. Cl.
*H01L 21/67* (2006.01)
*H01L 21/677* (2006.01)
*H01L 21/687* (2006.01)

(52) U.S. Cl.
CPC .. *H01L 21/67201* (2013.01); *H01L 21/67718* (2013.01); *H01L 21/68707* (2013.01)

(58) Field of Classification Search
CPC ......... H01L 21/67745; H01L 21/67161; H01L 21/67171; H01L 21/67201; H01L 21/67718; H01L 21/68707
See application file for complete search history.

(56) References Cited

U.S. PATENT DOCUMENTS

| | | | |
|---|---|---|---|
| 5,486,080 A | 1/1996 | Sieradzki | |
| 2007/0196011 A1 | 8/2007 | Cox et al. | |
| 2008/0075563 A1* | 3/2008 | McLane | H01L 21/67745 414/217 |
| 2009/0252578 A1* | 10/2009 | Machida | H01L 21/67745 901/14 |
| 2014/0178157 A1 | 6/2014 | Hofmeister et al. | |
| 2015/0206782 A1* | 7/2015 | Caveney | H01L 21/67196 414/217 |
| 2019/0237351 A1* | 8/2019 | Krupyshev | H01L 21/67259 |
| 2020/0161152 A1* | 5/2020 | Caveney | H01L 21/67742 |
| 2021/0020476 A1 | 1/2021 | Harbert et al. | |
| 2024/0145270 A1 | 5/2024 | Schaller et al. | |

FOREIGN PATENT DOCUMENTS

EP    1422742 A2 *    5/2004    ....... H01L 21/67201

OTHER PUBLICATIONS

International Search Report and Written Opinion mailed Dec. 29, 2023 in co-pending PCT application No. PCT/US2023/032516.
Office Action mailed Nov. 4, 2024 in co-pending U.S. Appl. No. 17/977,417.
Notice of Allowance mailed Apr. 4, 2025 in co-pending U.S. Appl. No. 17/977,417.

* cited by examiner

*Primary Examiner* — Kaitlin S Joerger
(74) *Attorney, Agent, or Firm* — Nields, Lemack & Frame, LLC

(57) ABSTRACT

A system for transferring semiconductor workpieces from a load lock to an orientation station and onto a platen is disclosed. The system comprises two load locks, a multi-workpiece orientation station, two multi-pick robots that transfer a plurality of workpieces between a respective load lock and the multi-workpiece orientation station, and two backend robots that transfer individual workpieces between the multi-workpiece orientation station and the platen.

19 Claims, 5 Drawing Sheets

WORKPIECE HANDLING ARCHITECTURE FOR HIGH WORKPIECE THROUGHPUT

FIELD

Embodiments relate to a system for achieving high workpiece throughput, and more specifically, higher throughput for semiconductor workpieces as they are processed.

BACKGROUND

Ions are used in a plurality of semiconductor processes, such as implantation, amorphization, deposition and etching processes. These semiconductor processes are typically performed in a process chamber, which is maintained at near vacuum conditions.

Before a semiconductor workpiece can be processed, it is transported from an ambient environment to the process chamber. Further, after being transported to the process chamber, the semiconductor workpiece is typically aligned in a specific orientation.

To achieve this sequence, one or more load locks are used to transition the workpieces between the ambient environment and the process chamber. Additionally, an orientation station is typically used to align the workpiece to the desired orientation. After these two processes are completed, the workpiece can then be mounted on the platen for processing.

Often, the transfer of workpieces from the load lock to the orientation station and onto the platen may represent a bottleneck in the semiconductor process. For example, the processing of a workpiece on the platen may take less than 5 seconds, which ideally allows the processing of at least 720 workpieces per hour. However, traditional transport systems limit the throughput to roughly 500 workpieces per hour.

Therefore, it would be beneficial if there was a system that transported workpieces between the load lock and the platen such that the semiconductor processing became the bottleneck in the process.

SUMMARY

A system for transferring semiconductor workpieces from a load lock to an orientation station and on to a platen is disclosed. The system comprises two load locks, a multi-workpiece orientation station, two multi-pick robots that transfer a plurality of workpieces between a respective load lock and the multi-workpiece orientation station, and two backend robots that transfer individual workpieces between the multi-workpiece orientation station and the platen.

According to one embodiment, a system for transporting workpieces to a platen is disclosed. The system comprises two load locks; a multi-workpiece orientation station, having a plurality of alignment slots for aligning each workpiece prior to being placed on the platen and a plurality of pass through slots for holding workpieces that have been processed; two multi-pick robots, each associated with a respective load lock and each having an arm having a plurality of picks to transfer a first plurality of workpieces between the respective load lock and the alignment slots of the multi-workpiece orientation station; and two backend robots to transfer workpieces between the multi-workpiece orientation station and the platen. In some embodiments, a first backend robot of the two backend robots is used to transfer an aligned workpiece from one of the alignment slots to the platen. In some embodiments, a second backend robot of the two backend robots is used to transfer a processed workpiece from the platen to one of the pass through slots. In certain embodiments, one of the two multi-pick robots transfers processed workpieces from the pass through slots to one of the two load locks when the first plurality of processed workpieces are available in the pass through slots. In some embodiments, the two load locks each have a stacked configuration, with two independent chambers. In certain embodiments, each independent chamber holds 2 or 3 workpieces. In some embodiments, the two multi-pick robots are each able to transfer 2 or 3 workpieces at a time. In some embodiments, the system comprises a plurality of front opening unified pods (FOUPs) and an atmospheric robot disposed in an ambient environment, wherein the atmospheric robot transfers workpieces between the two load locks and the FOUPs. In some embodiments, the atmospheric robot has a 1+N pick arrangement, enabling the atmospheric robot to transfer 1, N or N+1 workpieces at a time between the FOUPs and the two load locks.

According to another embodiment, a method of transferring workpieces between a plurality of load locks to a platen is disclosed. The method comprises moving a plurality of unprocessed workpieces at one time from one of the plurality of load locks to a multi-workpiece orientation station; aligning one of the plurality of unprocessed workpieces, referred to as an aligned workpiece; transferring the aligned workpiece from the multi-workpiece orientation station to the platen, where it is processed into a processed workpiece; transferring the processed workpiece to a pass through slot; and moving the processed workpiece and at least one additional workpiece from the pass through slot to one of the plurality of load locks at one time. In some embodiments, the pass through slot is located in the multi-workpiece orientation station. In some embodiments, a first backend robot is used to transfer the aligned workpiece from the multi-workpiece orientation station to the platen, and a second backend robot is used to transfer the processed workpiece to the pass through slot. In some embodiments, a number of processed workpieces moved from the pass through slot to the one of the plurality of load locks is equal to a number of unprocessed workpieces moved from one of the plurality of load locks to a multi-workpiece orientation station. In some embodiments, a multi-pick robot is used to move the plurality of unprocessed workpieces from one of the plurality of load locks to a multi-workpiece orientation station. In certain embodiments, a multi-pick robot is used to move the processed workpiece and the at least one additional workpiece from the pass through slot to one of the plurality of load locks. In certain embodiments, two multi-pick robots are used. In some embodiments, the plurality of unprocessed workpieces comprises 2 or 3 workpieces. In some embodiments, the plurality of load locks each have a stacked configuration, with two independent chambers. In certain embodiments, each independent chamber holds 2 or 3 workpieces.

BRIEF DESCRIPTION OF THE FIGURES

For a better understanding of the present disclosure, reference is made to the accompanying drawings, which are incorporated herein by reference and in which.

DETAILED DESCRIPTION

Figure 1:
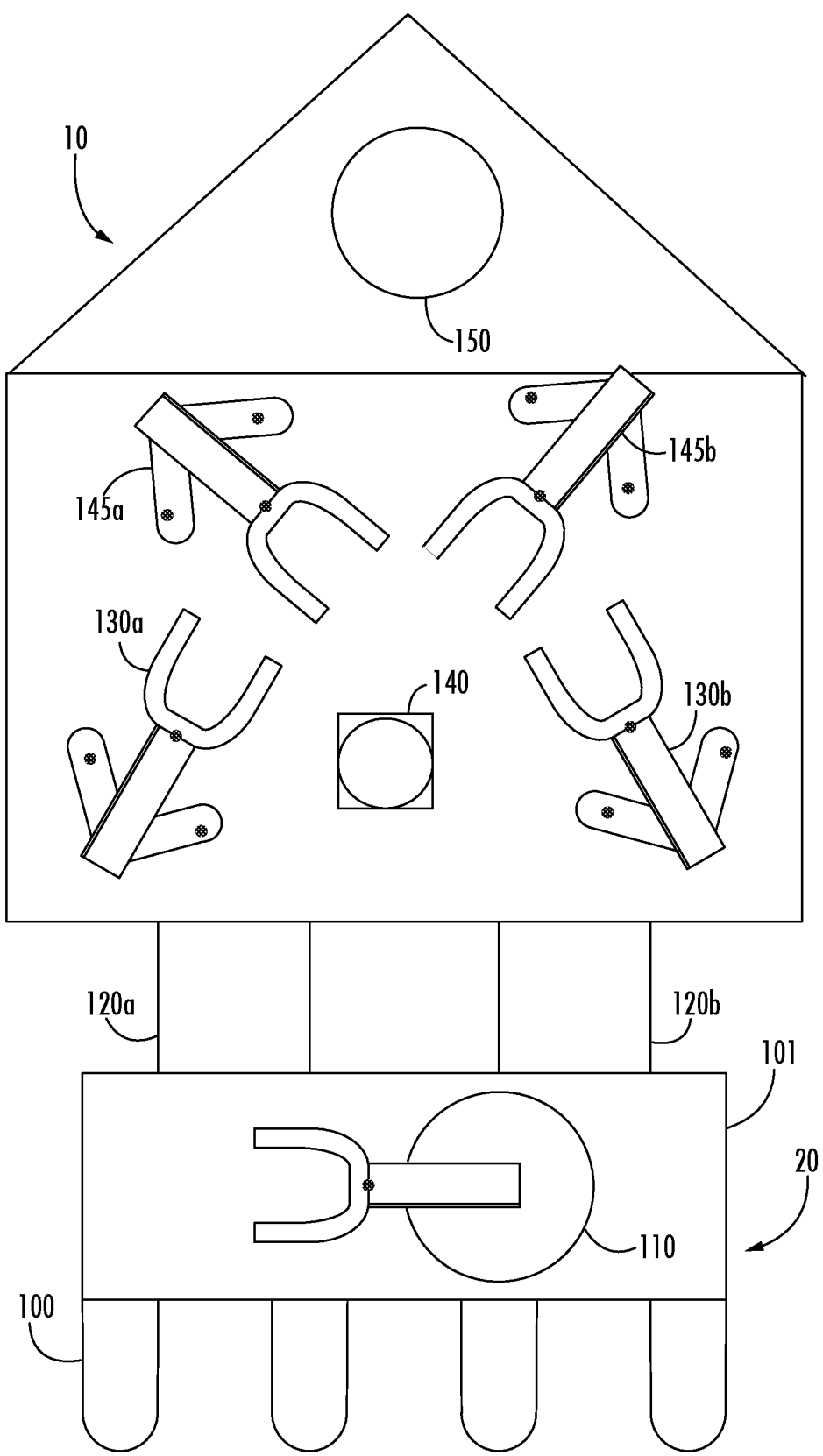
FIG. 1 shows the system for transporting workpieces according to one embodiment.

FIG. 1 shows one embodiment of a system for transporting workpieces. The system includes a plurality of FOUPs 100 (front opening unified pods). An EFEM 101 (Equipment Front End Module) includes an atmospheric robot 110 that is used to remove and replace workpieces from the FOUPs 100. The atmospheric robot 110 may have a 2+1 pick arrangement to enable it to transfer 1, 2 or 3 workpieces per exchange. In other words, the atmospheric robot 110 has two separately controllable arms, also referred to as dual yaw. In this embodiment, one of the arms has two picks that move together and the second arm has one pick. In another embodiment, the atmospheric robot 110 may have a 1+1 pick arrangement to enable it to transfer 1 or 2 workpieces per exchange. In another embodiment, the atmospheric robot 110 may have a 1+N pick arrangement, where N is 1 or greater.

The atmospheric robot 110 is used to move workpieces between the FOUPs 100 and the load locks 120a, 120b. In this figure, there are two load locks, a first load lock 120a and a second load lock 120b. Generally, assuming that the atmospheric robot 110 has a 1+N pick arrangement, the atmospheric robot 110 is able to transfer N+1, N or 1 workpieces at a time.

The load locks 120a, 120b are used to separate the process chamber 10 from the ambient environment 20.

Figure 2:
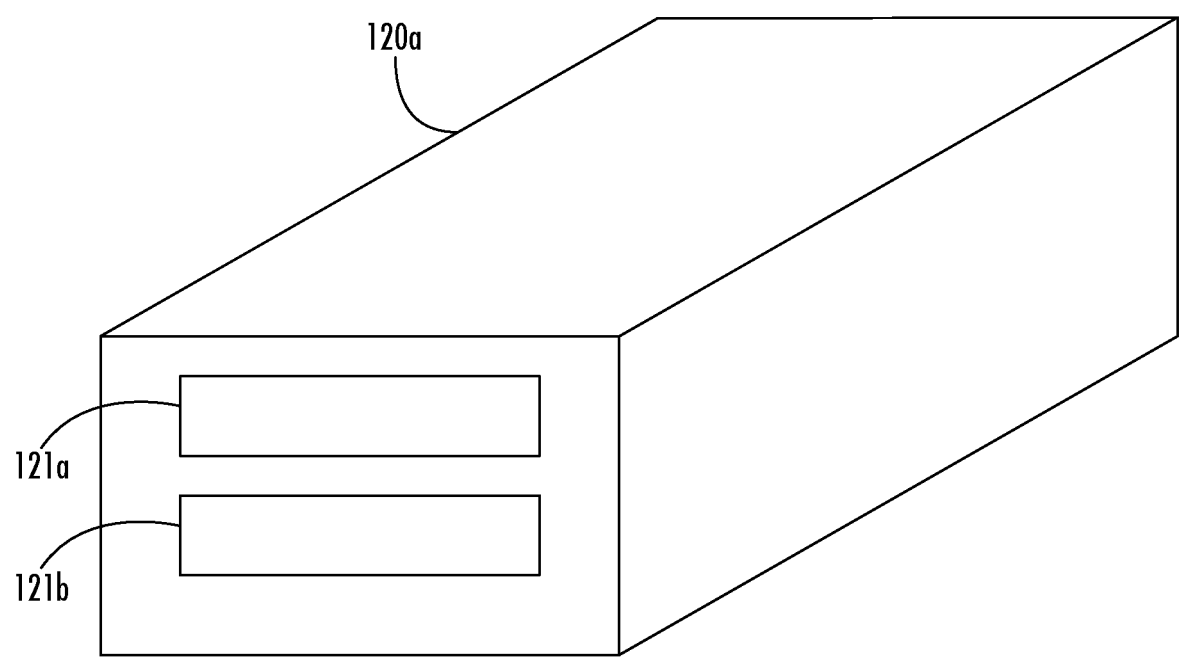
FIG. 2 shows a load lock according to one embodiment.

In one embodiment, shown in FIG. 2, the load locks 120a, 120b may each be a stacked configuration. Thus, each load lock 120a, 120b comprises two separately controllable chambers 121a, 121b. In this way, the first chamber 121a of the first load lock 120a may be open to the process chamber 10 while the second chamber 121b may or may not be open to the process chamber 10. In this way, one chamber may be presenting unprocessed workpieces to the process chamber 10 while the second chamber may be returning processed workpieces to the ambient environment 20.

Each chamber of the load lock may be capable of holding a plurality of workpieces. In one embodiment, each chamber holds 2 workpieces. In another embodiment, each chamber may hold 3 workpieces. Of course, the chamber may hold more workpieces, if desired.

Figure 3:
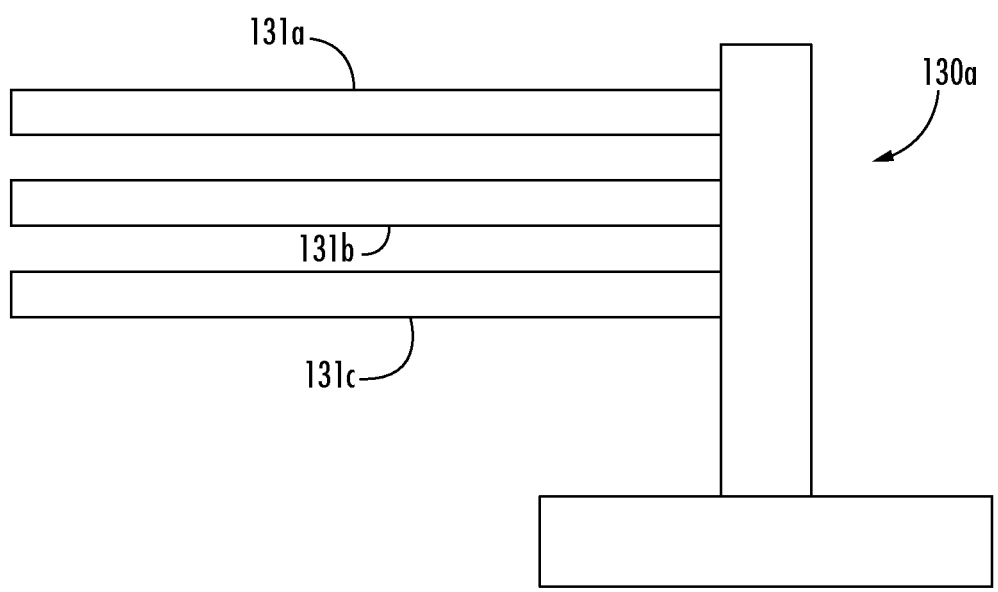
FIG. 3 shows a side view of the multi-pick robot according to one embodiment.

Disposed in the process chamber 10 are two multi-pick robots 130a, 130b. The multi-pick robots 130a, 130b may be SCARA (Selective Compliance Articulated Robotic Arm) type robots, capable of movement in the height direction, the radial direction and rotation in the yaw direction. The multi-pick robots 130a, 130b each have a plurality of picks disposed on the arm. These picks are fixed relative to one another. In some embodiments, there may be two picks per arm. In other embodiments, there may be three picks per arm. FIG. 3 shows a side view of the first multi-pick robot 130a, showing the first pick 131a, a second pick 131b and a third pick 131c. Note that in other embodiments, the first multi-pick robot 130a may only have a first pick 131a and a second pick 131b. The second multi-pick robot 130b is similarly configured.

A multi-workpiece orientation station 140 is also disposed in the process chamber 10. The multi-workpiece orientation station is used to align the workpiece to a particular orientation. The workpieces typically have a notch located along the edge that identifies the orientation of the workpiece. The multi-workpiece orientation station 140 is used to rotate the workpiece until the notch is in a predetermined position. The multi-workpiece orientation station 140 in the present system has a plurality of alignment slots, and can receive a plurality of workpieces at the same time. In some embodiments, only one workpiece is aligned at a time. In other embodiments, all of the workpieces can be aligned simultaneously. In addition to performing the alignment, the multi-workpiece orientation station 140 also has an equal number of pass through slots.

Figure 4:
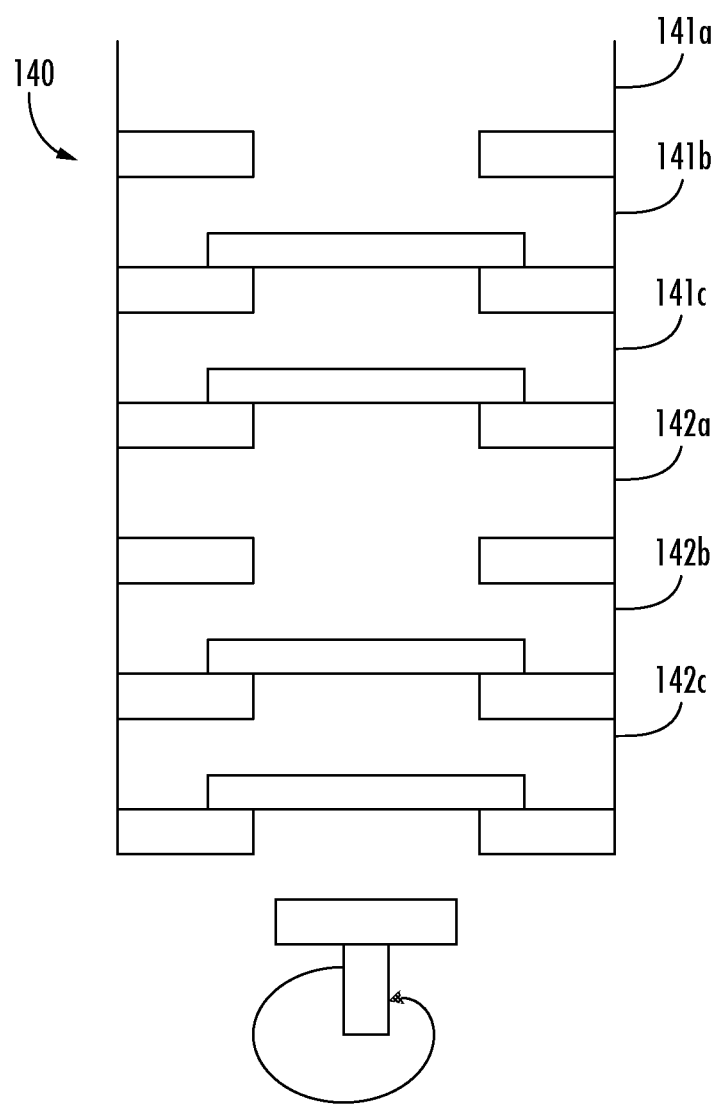
FIG. 4 shows the multi-workpiece orientation station according to one embodiment.

FIG. 4 shows the multi-workpiece orientation station 140 according to one embodiment. In this embodiment, the multi-workpiece orientation station 140 has three alignment slots 141a, 141b, 141c that are used to align workpieces. The alignment slots are vertically aligned with each other. In other embodiments, the multi-workpiece orientation station 140 may have a different number of alignment slots, such as two or more than three. Each alignment slot 141a, 141b, 141c may have a dedicated alignment mechanism. For example, each alignment mechanism may include a sensor, which is used to detect the notch in the workpiece. In some embodiments, the sensor may be a camera. In another embodiment, a light may be disposed on one side of the workpiece. The light may be directed toward the edge of the workpiece and the sensor, located on the opposite side of the workpiece, is used to detect the presence of the notch. The position of the notch is determined based on an increase in the received light by the sensor. Of course, other alignment mechanisms may be used. The multi-workpiece orientation station 140 may also have an equal number of pass through slots 142a, 142b, and 142c. The pass through slots are also vertically aligned with one another. Note that the multi-workpiece orientation station 140 typically has an equal number of alignment slots and pass through slots, although other configurations may be used. In some embodiments, the alignment slots and pass through slots are all vertically aligned with each other.

The multi-workpiece orientation station 140 is located in a position where both the first multi-pick robot 130a and the second multi-pick robot 130b are able to access it.

Beyond the multi-workpiece orientation station 140 is the platen 150. The aligned workpiece is placed on platen 150 so that it can be processed. For example, while on the platen 150, the workpiece may be subject to ion implantation, etching or some other process. In some embodiments, the platen may be an electrostatic chuck.

There are two backend robots 145a, 145b, each of which has a single pick. The backend robots 145a, 145b may be SCARA (Selective Compliance Articulated Robotic Arm) type robots, capable of movement in the height direction, the radial direction and rotation in the yaw direction. The first backend robot 145a is used to move the aligned workpieces from the multi-workpiece orientation station 140 to the platen 150. The aligned workpieces are located in the alignment slots 141a-141c. Note that the first backend robot 145a only transfers one aligned workpiece at a time to the platen 150. The second backend robot 145b is used to move processed workpieces from the platen 150 to the multi-workpiece orientation station 140, and more specifically to the pass through slots 142a-142c. In some embodiments, the first backend robot 145a only transfers workpieces to the platen 150 and the second backend robot 145b only transfers workpieces from the platen 150.

The platen 150 and the multi-workpiece orientation station 140 are located in a position where the first backend robot 145a and the second backend robot 145b are each able to access both of them.

Having described the structure of the system, the operation of each robot will now be explained with reference to FIG. 5.

As shown in Box 500, the first multi-pick robot 130a is used to remove a plurality of unprocessed workpieces from the first load lock 120a. In certain embodiments, the number of picks that each multi-pick robot has is equal to the number of workpieces that is contained in one of the chambers 121a, 121b of the load lock. Thus, if the first multi-pick robot 130a has three picks, each chamber 121a, 121b of the first load lock 120a is used to hold three workpieces. Similarly, if the first multi-pick robot 130a has two picks, the chamber 121a, 121b of the first load lock 120a would be used to hold two workpieces.

The first multi-pick robot 130a then deposits the unprocessed workpieces on respective alignment slots 141a-141c of the multi-workpiece orientation station 140, as shown in Box 510. Later, as shown in Box 520, the first backend robot 145a then removes one of the aligned workpieces from one of the alignment slots 141a-141c and transfers it to the platen 150. When the workpiece has been processed, the second backend robot 145b transfers the processed workpiece to one of the pass through slots 142a-142c, as shown in Box 530. While the workpiece was being processed, the first backend robot 145a returned to the multi-workpiece orientation station 140 and retrieved a second aligned workpiece. In this way, the first backend robot 145a is ready to place an aligned workpiece on the platen 150 as soon as the previous workpiece is removed by the second backend robot 145b.

Once the plurality of workpieces, which may be 2, 3 or another number, have been processed and returned to the pass through slots 142a-142c, one of the first multi-pick robot 130a or the second multi-pick robot 130b returns the plurality of processed workpieces to its respective load lock, as shown in Box 540. In certain embodiments, the processed workpieces are returned by the same multi-pick robot that originally removed those workpieces from the load lock. However, in other embodiments, the processed workpieces are returned by the other multi-pick robot that did not originally remove those workpieces from the load lock.

The second multi-pick robot 130b operates in the same manner as the first multi-pick robot 130a. It removes a plurality of unprocessed workpieces from the second load lock 120b and transfers them to the alignment slots 141a-141c of the multi-workpiece orientation station 140. It then returns a plurality of processed workpieces from the pass through slots 142a-142c to the second load lock 120b.

Figure 5:
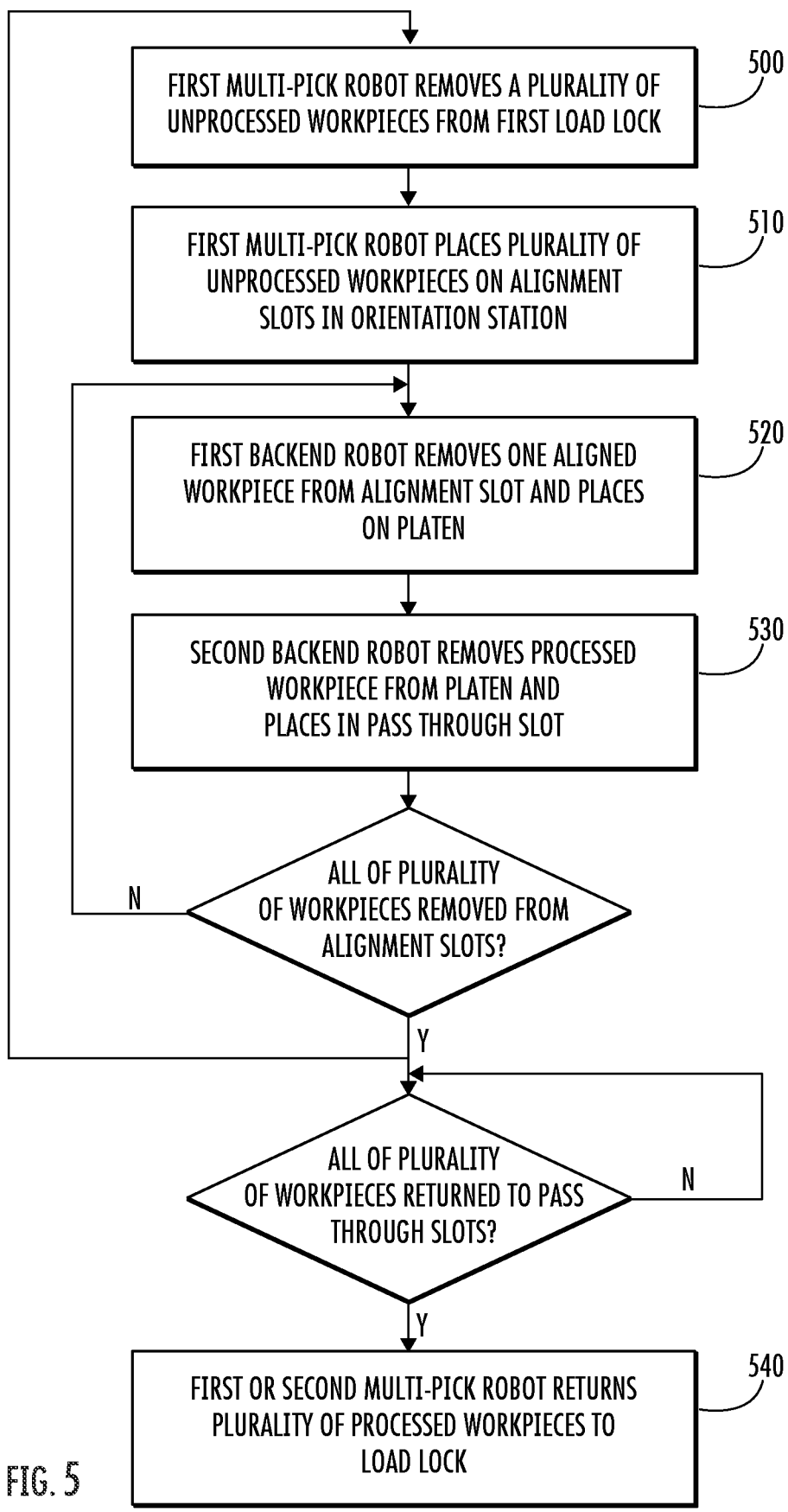
FIG. 5 is a flowchart showing the sequence of operations to process a workpiece and return it to the load lock.

While FIG. 5 shows the first multi-pick robot 130a removing the plurality of unprocessed workpieces after the last aligned workpiece is removed from the alignment slots, it is understood that the first multi-pick robot 130a may return the load lock any time after the unprocessed workpieces have been placed in the alignment slots.

The present apparatus has many advantages. By utilizing two multi-pick robots and two backend robots, it is possible to dramatically improve the throughput of the system. In certain tests, throughputs in excess of 900 workpieces per hours may be achieved. Further, if the desired throughput is lower, such as 650 workpieces per hour, the backend robots may be able to move more slowly. In fact, in certain embodiments, the backend robots may more slowly at high throughput than current existing systems. This improves handling reliability and the time between preventative maintenance.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A system for transporting workpieces to a platen, comprising:
   two load locks;
   a multi-workpiece orientation station, having a plurality of alignment slots, each alignment slot configured to align a respective workpiece prior to being placed on the platen, and a plurality of pass through slots, each pass through slot configured to hold a workpiece that has been processed;
   two multi-pick robots, each associated with a respective load lock and each having an arm having a plurality of picks to transfer a first plurality of workpieces from the respective load lock to the alignment slots of the multi-workpiece orientation station, wherein each of the first plurality of workpieces is placed in a respective alignment slot to be aligned; and
   two backend robots, each of which configured to transfer workpieces between the multi-workpiece orientation station and the platen.

2. The system of claim 1, wherein a first backend robot of the two backend robots is used to transfer an aligned workpiece from one of the alignment slots to the platen.

3. The system of claim 2, wherein a second backend robot of the two backend robots is used to transfer a processed workpiece from the platen to one of the pass through slots.

4. The system of claim 3, wherein one of the two multi-pick robots transfers processed workpieces from the pass through slots to one of the two load locks when the first plurality of processed workpieces are available in the pass through slots.

5. The system of claim 1, wherein the two load locks each have a stacked configuration, with two independent chambers.

6. The system of claim 5, wherein each independent chamber holds 2 or 3 workpieces.

7. The system of claim 1, wherein the two multi-pick robots are each able to transfer 2 or 3 workpieces at a time.

8. The system of claim 1, further comprising a plurality of front opening unified pods (FOUPs) and an atmospheric robot disposed in an ambient environment, wherein the atmospheric robot transfers workpieces between the two load locks and the FOUPs.

9. The system of claim 8, wherein the atmospheric robot has a 1+N pick arrangement, enabling the atmospheric robot to transfer 1, N or N+1 workpieces at a time between the FOUPs and the two load locks.

10. A method of transferring workpieces between a plurality of load locks to a platen, comprising:
    moving a plurality of unprocessed workpieces at one time from one of the plurality of load locks to a multi-workpiece orientation station, wherein each unprocessed workpiece is placed in a respective alignment slot in the multi-workpiece orientation station;

aligning one of the plurality of unprocessed workpieces, referred to as an aligned workpiece;

transferring the aligned workpiece from the multi-workpiece orientation station to the platen, where it is processed into a processed workpiece;

transferring the processed workpiece to a pass through slot; and moving the processed workpiece from the pass through slot and at least one additional processed workpiece from at least one other pass through slot to one of the plurality of load locks at one time.

11. The method of claim 10, wherein the pass through slot and the at least one other pass through slot are located in the multi-workpiece orientation station.

12. The method of claim 10, wherein a first backend robot is used to transfer the aligned workpiece from the multi-workpiece orientation station to the platen, and a second backend robot is used to transfer the processed workpiece to the pass through slot.

13. The method of claim 10, wherein a number of processed workpieces moved from the pass through slot and the at least one other pass through slot to the one of the plurality of load locks is equal to a number of unprocessed workpieces moved from one of the plurality of load locks to a multi-workpiece orientation station.

14. The method of claim 10, wherein a multi-pick robot is used to move the plurality of unprocessed workpieces from one of the plurality of load locks to a multi-workpiece orientation station.

15. The method of claim 14, wherein a multi-pick robot is used to move the processed workpiece from the pass through slot and the at least one additional processed workpiece from the at least one other pass through slot to one of the plurality of load locks.

16. The method of claim 15, wherein two multi-pick robots are used.

17. The method of claim 10, wherein the plurality of unprocessed workpieces comprises 2 or 3 workpieces.

18. The method of claim 10, wherein the plurality of load locks each have a stacked configuration, with two independent chambers.

19. The method of claim 18, wherein each independent chamber holds 2 or 3 workpieces.

* * * * *